(12) United States Patent
Choi

(10) Patent No.: US 9,142,267 B1
(45) Date of Patent: Sep. 22, 2015

(54) POWER GENERATOR FOR DATA LINE OF MEMORY APPARATUS

(71) Applicant: NANYA TECHNOLOGY CORPORATION, Taoyuan (TW)

(72) Inventor: Hoon Choi, Boise, ID (US)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 52 days.

(21) Appl. No.: 14/215,086

(22) Filed: Mar. 17, 2014

(51) Int. Cl.
*G11C 7/10* (2006.01)
*G11C 5/14* (2006.01)

(52) U.S. Cl.
CPC .............. *G11C 7/1078* (2013.01); *G11C 5/147* (2013.01)

(58) Field of Classification Search
CPC .... G11C 7/1051; G11C 7/1078; G11C 5/147; G11C 5/14

USPC ............................................. 365/189.05, 226
See application file for complete search history.

(56) References Cited

U.S. PATENT DOCUMENTS 7,126,859 B2 * 10/2006 Seki .......................... 365/189.05

* cited by examiner

*Primary Examiner* — Huan Hoang
(74) *Attorney, Agent, or Firm* — Jianq Chyun IP Office

(57) ABSTRACT

The invention provides the power generator includes a bias voltage generator and a voltage clamping circuit. The bias voltage generator receives a reference voltage and generates a bias voltage according to the reference voltage. The voltage clamping circuit is coupled to the bias voltage generator. The voltage clamping circuit receives a supply voltage and the bias voltage and respectively outputs a plurality of data line power to the data transporting buffers by clamping the supply voltage according to the bias voltage. Wherein, the supply voltage is varied between a voltage range, and voltage levels of the data line powers are all constant.

7 Claims, 2 Drawing Sheets

POWER GENERATOR FOR DATA LINE OF MEMORY APPARATUS

BACKGROUND OF THE INVENTION

1. Field of Invention

The present invention generally relates to a power generator of a memory apparatus, and more particularly to the power generator for data transporting buffers of the memory apparatus.

2. Description of Prior Art

Along with the rapid development of science and technology at the present, a mobile electronic apparatus is necessary for a person for regular using. In mobile application, the power consumption is the most critical factor as times goes by. For a system with memory apparatus, a memory apparatus with high bandwidth and low power consumption is necessary.

For meeting the high bandwidth demand, larger amount data lines for reading and writing operation are disposed in the memory apparatus. Therefore, when a plurality of data transporting buffers on the data lines are in transition, the biggest power consumption is happened. That is, it is an important subject for a designer of the memory apparatus for saving the power consumption in the data lines and without reducing the bandwidth of the memory apparatus.

SUMMARY OF THE INVENTION

The present invention provides a power generator for data transporting buffers of a memory apparatus for meeting low power consumption and high speed requirements.

The present invention provides the power generator includes a bias voltage generator and a voltage clamping circuit. The bias voltage generator receives a reference voltage and generates a bias voltage according to the reference voltage. The voltage clamping circuit is coupled to the bias voltage generator. The voltage clamping circuit receives a supply voltage and the bias voltage and respectively outputs a plurality of data line power to the data transporting buffers by clamping the supply voltage according to the bias voltage. Wherein, the supply voltage is varied between a voltage range, and voltage levels of the data line powers are all constant.

In an embodiment of present disclosure, the bias voltage generator includes a reference voltage generator and a voltage output buffer. The reference voltage generator generates the reference voltage. The voltage output buffer is coupled to the reference voltage generator, and the voltage output buffer receives the reference voltage and generates the bias voltage according to the reference voltage.

In an embodiment of present disclosure, the voltage output buffer includes an operation amplifier. The operation amplifier has a first input end, a second input end and an output end. The first input end of the operation amplifier is coupled to the reference voltage generator for receiving the reference voltage, the second input end of the operation amplifier is coupled to the output end of the operation amplifier, and the output end of the operation amplifier provides the bias voltage.

In an embodiment of present disclosure, the voltage clamping circuit includes a first N-type transistor and a second N-type transistor. The first N-type transistor has a first end, a second end and a control end. The first end of the first N-type transistor receives the supply voltage. The control end of the first N-type transistor is couple to the bias voltage generator for receiving the bias voltage. The second end of the first N-type transistor provides a first data line power of the data line powers. The second N-type transistor has a first end, a second end and a control end, the first end of the second N-type transistor receives the supply voltage, the control end of the second N-type transistor is couple to the bias voltage generator for receiving the bias voltage, the second end of the second N-type transistor provides a second data line power of the data line powers.

In an embodiment of present disclosure, wherein the first data line power is provided to at least one read transporting buffer of the data transporting buffers, the read transporting buffer is used for transporting data read out from a plurality memory cells of the memory apparatus.

In an embodiment of present disclosure, wherein the second data line power is provided to at least one write transporting buffer of the data transporting buffers, the write transporting buffer is used for transporting data write into the memory cells of the memory apparatus.

In an embodiment of present disclosure, wherein the bias voltage generator stops to provide the bias voltage to the voltage clamping circuit when the memory apparatus is operated in a non-accessing mode.

Accordingly, since the data line powers provided to the data transporting buffers are generated by clamping the supply voltage according to the bias voltage. When the supply voltage is raised, voltage levels of the data line powers keep on a constant value, and the power consumption is not increased, and the bandwidth of the memory apparatus is not reduced, either.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
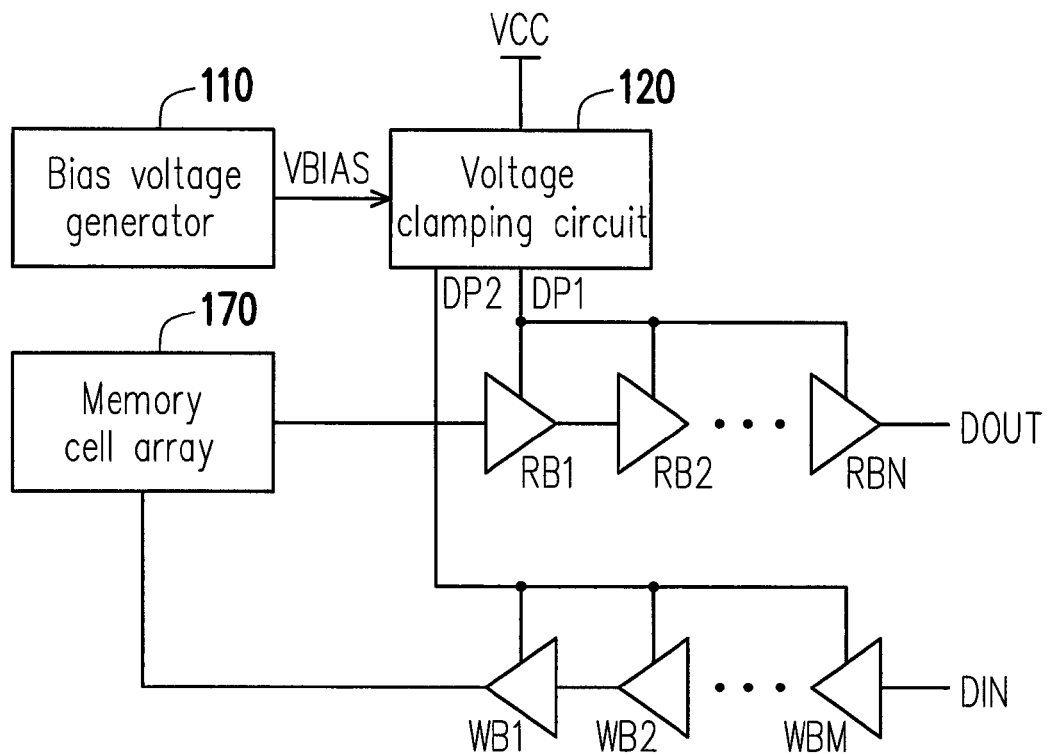
FIG. 1 is a block diagram of a power generator 100 according to an embodiment of the present invention.

Reference will now be made in detail to the present preferred embodiment of the invention, examples of which are illustrated in the accompanying drawings. Wherever possible, the same reference numbers are used in the drawings and the description to refer to the same or like parts.

Please referring to FIG. 1, FIG. 1 is a block diagram of a power generator 100 according to an embodiment of the present invention. The power generator 100 includes a bias voltage generator 110 and a voltage clamping circuit 120. The bias voltage generator 110 is coupled to the voltage clamping circuit 120, and the voltage generator 110 generates a bias voltage VBIAS according to a reference voltage. Te voltage generator 110 provides the bias voltage VBIAS to the voltage clamping circuit 120. The voltage clamping circuit 120 receives a supply voltage VCC and the bias voltage VBIAS, and the voltage clamping circuit 120 clamps a voltage level of the supply voltage VCC to generate a plurality of data line powers DP1 and DP2. In this embodiment, the data line powers DP1 and DP2 are respectively provided to the data transporting buffers RB1-RBN and WB1-WBM. Please notice here, the data line power DP1 is provided to the data transporting buffers RB1-RBN to be an operating power of the data transporting buffers RB1-RBN, and the data line power DP2 is provided to the data transporting buffers WB1-WBM to be an operating power of the data transporting buffers WB1-WBM. Moreover, the supply voltage VCC may be varied between a voltage range, and the voltage levels of the data line powers DP1 and DP2 are all constant.

That is, when the voltage level of the supply voltage VCC is raised to a higher bound of the voltage range, the data line powers DP1 and DP2 are not varied according to the variation of the supply voltage VCC. On the contrast, voltage levels of the data line powers DP1 and DP2 are keeping on a constant value, and the power consumption for the data transporting buffers RB1-RBN and WB1-WBM is not increased.

Besides, the data transporting buffers RB1-RBN are coupled in series, and an input end of the data transporting buffers RB1 is coupled to a memory cell array 170. The memory cell array 170 includes a plurality of memory cells, and the data transporting buffers RB1 is used to receive a data read out from at least one of the memory cells. The data transporting buffers RB1-RBN are used to transport the data read out from at least one of the memory cells to a read-out data DOUT for external user. The data transporting buffers RB1-RBN are read transporting buffers.

The data transporting buffers WB1-WBM are also coupled in series. An output end of the data transporting buffers WB1 is coupled to a memory cell array 170, and an input end of the data transporting buffer WBM for receiving a write-in data DIN. The data transporting buffers WB1-WBM are used to transport the write-in data DIN to at least one of the memory cells of the memory cell array 170. The data transporting buffers WB1-WBM are write transporting buffers.

The amount of the data transporting buffers WB1-WBM and RB1-RBN are not limited in this embodiment. A designer for the memory apparatus may determine the number of data transporting buffers WB1-WBM and RB1-RBN by necessary.

The bias voltage generator 110 may stop to provide the bias voltage VBAIS to the voltage clamping circuit 120 when the memory apparatus is operated in a non-accessing mode.

Figure 2:
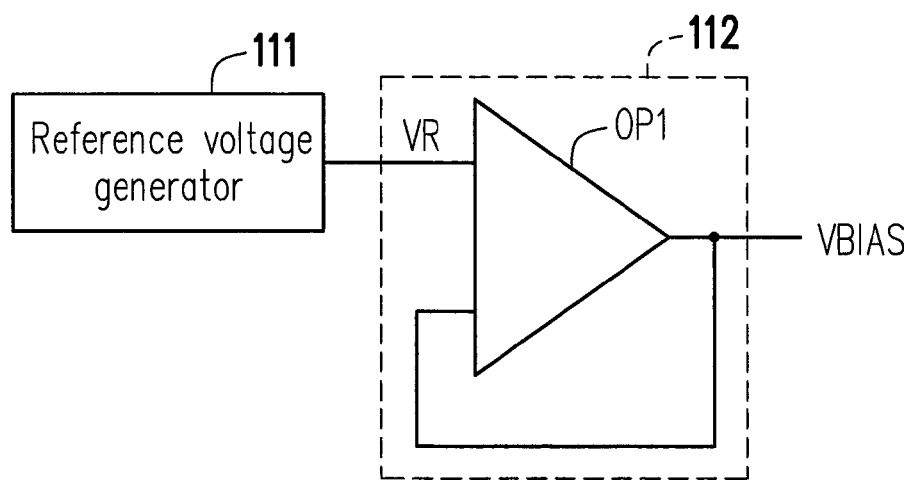
FIG. 2 is a block diagram of the bias voltage generator 110 according to an embodiment of the present invention.

Please referring to FIG. 2, FIG. 2 is a block diagram of the bias voltage generator 110 according to an embodiment of the present invention. The bias voltage generator 110 includes a reference voltage generator 111 and a voltage output buffer 112. The reference voltage generator 111 generates a reference voltage VR, and provides the reference voltage VR to the voltage output buffer 112. The voltage output buffer 112 is coupled to the reference voltage generator 111. The voltage output buffer 112 receives the reference voltage VR and generates the bias voltage VBIAS according to the reference voltage VR. In this embodiment, the voltage output buffer 112 is a voltage follower. The voltage output buffer 112 includes an operation amplifier OP1. The operation amplifier OP1 has a first input end, a second input end and an output end. The first input end of the operation amplifier OP1 is coupled to the reference voltage generator 111 for receiving the reference voltage VR. The second input end of the operation amplifier OP1 is coupled to the output end of the operation amplifier OP1, and the output end of the operation amplifier OP1 provides the bias voltage VBIAS.

Figure 3:
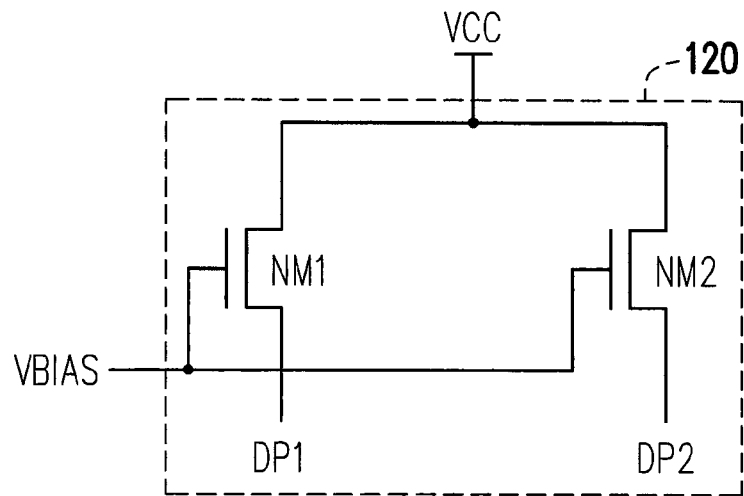
FIG. 3 is a circuit diagram of the voltage clamping circuit 120 according to an embodiment of the present invention.

Please referring to FIG. 3, FIG. 3 is a circuit diagram of the voltage clamping circuit 120 according to an embodiment of the present invention. The voltage clamping circuit 120 includes a first N-type transistor NM1 and a second N-type transistor NM2. The first N-type transistor NM1 has a first end, second end and a control end. The first end of the first N-type transistor NM1 may be a source of the first N-type transistor NM1, the second end of the first N-type transistor NM1 may be a drain of the first N-type transistor NM1, and the control end may be a gate of the first N-type transistor NM1. Furthermore, the first end of the first N-type transistor NM1 receives the supply voltage VCC, the control end of the first N-type transistor NM1 is couple to the bias voltage generator 110 for receiving the bias voltage VBIAS, the second end of the first N-type transistor NM1 provides a first data line power DP1.

The second N-type transistor NM2 has a first end, second end and a control end. The first end of the second N-type transistor NM2 may be a source of the second N-type transistor NM2, the second end of the second N-type transistor NM2 may be a drain of the second N-type transistor NM2, and the control end may be a gate of the second N-type transistor NM2. Furthermore, the first end of the second N-type transistor NM2 receives the supply voltage VCC, the control end of the second N-type transistor NM2 is couple to the bias voltage generator 110 for receiving the bias voltage VBIAS, the second end of the second N-type transistor NM2 provides a second data line power DP2.

In detail, for example, the threshold value of the first and second N-type transistor NM1 and NM2, and the supply voltage VCC may be varied between a voltage range from 1.0V to 1.4V. The voltage level of the bias voltage VBIAS is set to 1.4V. In this case, the voltage levels of the data line powers DP1 and DP2 are 1.0V when the voltage level of the supply voltage VCC is 1.0V, and the voltage levels of the data line powers DP1 and DP2 are also 1.0V when the voltage level of the supply voltage VCC is 1.4V. As the description above, the voltage levels of the data line powers DP1 and DP2 are constant and independent from the voltage variation of the supply voltage VCC based on the voltage regulating by the characteristics of the first and second N-type transistors NM1 and NM2. Therefore, there is no accessing speed loss when the voltage level of the supply voltage VCC is in a lower voltage level condition.

On the other hand, when the voltage level of the supply voltage VCC is raised to a higher voltage level condition (the voltage level of the supply voltage VCC is 1.4V, for example), the voltage levels of the data line powers DP1 and DP2 are held on 1.0V based on the voltage regulating by the characteristics of the first and second N-type transistors NM1 and NM2, too. That is, the power consumption for the data transporting buffers in the memory apparatus is not increased, and the power saving purpose is achieved.

In additional, the first and second N-type transistors NM1 and NM2 may be replaced by other active electronic components, such as diodes. In the embodiment, the voltage clamping circuit 120 may be constructed by the active electronic components which can generate the first and second data line power DP1 and DP2 by reducing the voltage level of the supply voltage VCC.

Figures 4A, 4B:
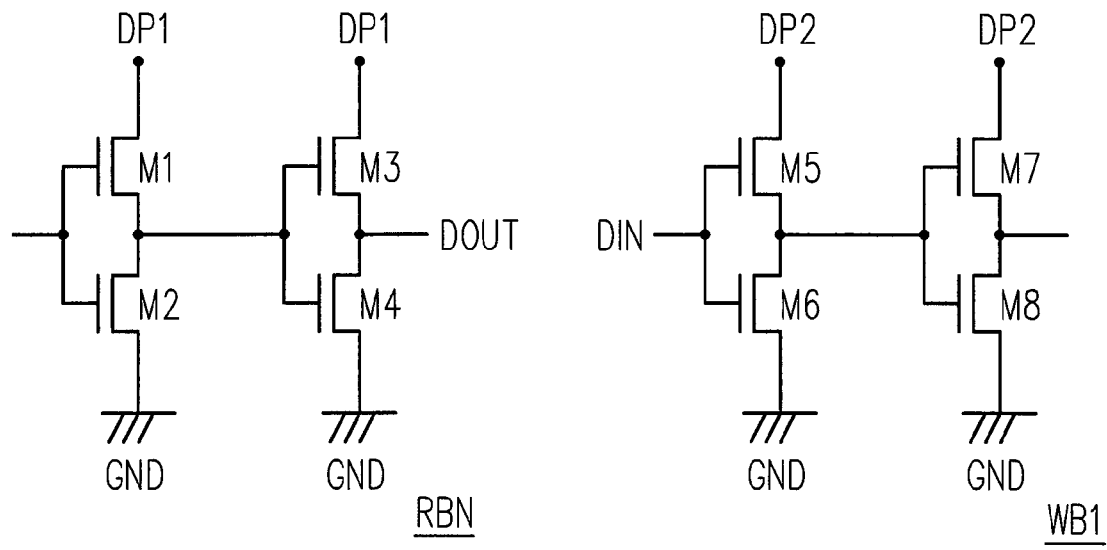
FIG. 4A and FIG. 4B are circuit diagram of the data transporting buffers RBN and WB1 respectively according to an embodiment of the present invention.

FIG. 4A and FIG. 4B are circuit diagram of the data transporting buffers RBN and WB1 respectively according to an embodiment of the present invention. In FIG. 4A, the data transporting buffers RBN includes transistors M1-M4. A first end of the transistor M1 is coupled to the data line power DP1 and a control end of the transistor M1 is coupled to a control of the transistor M2. A second end of the transistor M1 is coupled to a first end of the transistor M2 and a second end of the transistor M2 is coupled to a ground voltage GND. The transistors M1 and M2 forms an first inverter of data transporting buffers RBN, and the control ends of the transistors M1 and M2 form an input end of the first inverter and the second end of the transistor M1 and the first end of the transistor M2 form an output end of the first inverter. Besides, a first end of the transistor M3 is coupled to the data line power DP1 and a control end of the transistor M3 is coupled to a control of the transistor M4. A second end of the transistor M3 is coupled to a first end of the transistor M4 and a second end of the transistor M4 is coupled to a ground voltage GND. The transistors M3 and M4 forms an second inverter of data transporting buffers RBN, and the control ends of the transistors M3 and M4 form an input end of the second inverter and the second end of the transistor M3 and the first end of the transistor M4 form an output end of the second inverter. The output end of the first inverter is coupled to the input end of the second inverter. The output end of the second inverter generates the read-out data DOUT.

In FIG. 4B, the data transporting buffers WB1 includes transistors M5-M8. A first end of the transistor M5 is coupled to the data line power DP1 and a control end of the transistor M5 is coupled to a control of the transistor M6. A second end of the transistor M5 is coupled to a first end of the transistor M6 and a second end of the transistor M6 is coupled to a ground voltage GND. The transistors M5 and M6 forms an first inverter of data transporting buffers WB1, and the control ends of the transistors M5 and M6 form an input end of the first inverter and the second end of the transistor M5 and the first end of the transistor M6 form an output end of the first inverter. Besides, a first end of the transistor M7 is coupled to the data line power DP1 and a control end of the transistor M7 is coupled to a control of the transistor M8. A second end of the transistor M7 is coupled to a first end of the transistor M8 and a second end of the transistor M8 is coupled to a ground voltage GND. The transistors M7 and M8 forms an second inverter of data transporting buffers WB1, and the control ends of the transistors M7 and M8 form an input end of the second inverter and the second end of the transistor M7 and the first end of the transistor M8 form an output end of the second inverter. The output end of the first inverter is coupled to the input end of the second inverter. The input end of the first inverter receives the write-in data DIN.

To sum the discussion above, by controlling the voltage level of the bias voltage VBIAS, the bandwidth and power saving purposes can be met at same time. Besides, the voltage level of the bias voltage VBIAS may be adjusted according to the process parameter of each of memory chips to overcome the process variation effect to each of the memory chips.

What is claimed is:

1. A power generator for data transporting buffers of a memory apparatus, comprising:
   a bias voltage generator, generating a bias voltage according to a reference voltage; and
   a voltage clamping circuit, coupled to the bias voltage generator, the voltage clamping circuit receiving a supply voltage and the bias voltage and respectively outputting a plurality of data line powers to the data transporting buffers by clamping the supply voltage according to the bias voltage,
   wherein, the supply voltage is varied between a voltage range, and voltage levels of the data line powers are all constant.

2. The power generator according to claim 1, wherein the bias voltage generator comprises:
   a reference voltage generator generates the reference voltage; and
   a voltage output buffer is coupled to the reference voltage generator, and the voltage output buffer receives the reference voltage and generates the bias voltage according to the reference voltage.

3. The power generator according to claim 2, wherein the voltage output buffer comprises:
   an operation amplifier, has a first input end, a second input end and an output end, the first input end of the operation amplifier is coupled to the reference voltage generator for receiving the reference voltage, the second input end of the operation amplifier is coupled to the output end of the operation amplifier, and the output end of the operation amplifier provides the bias voltage.

4. The power generator according to claim 1, wherein the voltage clamping circuit comprises:
   a first N-type transistor, has a first end, a second end and a control end, the first end of the first N-type transistor receives the supply voltage, the control end of the first N-type transistor is couple to the bias voltage generator for receiving the bias voltage, the second end of the first N-type transistor provides a first data line power of the data line powers; and
   a second N-type transistor, has a first end, a second end and a control end, the first end of the second N-type transistor receives the supply voltage, the control end of the second N-type transistor is couple to the bias voltage generator for receiving the bias voltage, the second end of the second N-type transistor provides a second data line power of the data line powers.

5. The power generator according to claim 4, wherein the first data line power is provided to at least one read transporting buffer of the data transporting buffers, the read transporting buffer is used for transporting data read out from a plurality memory cells of the memory apparatus.

6. The power generator according to claim 5, wherein the second data line power is provided to at least one write transporting buffer of the data transporting buffers, the write transporting buffer is used for transporting data write into the memory cells of the memory apparatus.

7. The power generator according to claim 1, wherein the bias voltage generator stops to provide the bias voltage to the voltage clamping circuit when the memory apparatus is operated in a non-accessing mode.

* * * * *